US008350797B2

United States Patent
Song et al.

(10) Patent No.: US 8,350,797 B2
(45) Date of Patent: Jan. 8, 2013

(54) BUFFER AMPLIFIER WITH MINIMIZED POWER CONSUMPTION AND DISPLAY DRIVER INCLUDING THE SAME

(75) Inventors: Junho Song, Seoul (KR); Chang-Ho An, Hwaseong-si (KR); Chul-Ho Choi, Seoul (KR); Min-Sung Kim, Incheon (KR); Mi-Ran Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1010 days.

(21) Appl. No.: 12/217,781

(22) Filed: Jul. 9, 2008

(65) Prior Publication Data

US 2009/0179876 A1    Jul. 16, 2009

(30) Foreign Application Priority Data

Jan. 16, 2008    (KR) ........................ 10-2008-0005074

(51) Int. Cl.
 *G09G 3/36*    (2006.01)
(52) U.S. Cl. ...................................... 345/100
(58) Field of Classification Search .................. 345/100; 330/253, 255, 257, 297
 See application file for complete search history.

(56) References Cited

U.S. PATENT DOCUMENTS

| | | | | |
|---|---|---|---|---|
| 6,166,580 A * | 12/2000 | Sessions | ........................ | 327/333 |
| 2002/0171613 A1 * | 11/2002 | Goto et al. | ....................... | 345/87 |
| 2007/0013641 A1 * | 1/2007 | Kim | ............................... | 345/100 |
| 2008/0174372 A1 * | 7/2008 | Tucker et al. | ................. | 330/297 |

OTHER PUBLICATIONS

Korean Patent Application No. 1020040113923 to Lee et al., having Publication date of Jul. 3, 2006 (w/ English Abstract page).
Japanese Patent Application No. 11-084716 to Oizumi et al., having Publication date of Oct. 6, 2000 (w/ English Abstract page).
Japanese Patent Application No. 2004-171670 to Tseng et al., having Publication date of Sep. 29, 2005 (w/ English Abstract page).

* cited by examiner

*Primary Examiner* — Chanh Nguyen
*Assistant Examiner* — Sanghyuk Park
(74) *Attorney, Agent, or Firm* — Monica H. Choi

(57) ABSTRACT

A buffer amplifier includes an input stage and an output stage. The input stage has input high and low power voltages applied thereon for generating at least one transmission signal from an input signal. The output stage has output high and low power voltages applied thereon for generating an output signal from the at least one transmission signal. A first difference between the output high and low power voltages is less than a second difference between the input high and low power voltages for reducing the dynamic power consumption of the output stage.

11 Claims, 16 Drawing Sheets

BUFFER AMPLIFIER WITH MINIMIZED POWER CONSUMPTION AND DISPLAY DRIVER INCLUDING THE SAME

BACKGROUND OF THE INVENTION

This application claims priority under 35 USC §119 to Korean Patent Application No. 10-2008-0005074, filed on Jan. 16, 2008 in the Korean Intellectual Property Office, the disclosure of which is incorporated herein in its entirety by reference.

1. Field of the Invention

The present invention relates generally to buffer amplifiers and display drivers including buffer amplifiers, and more particularly to a buffer amplifier with reduced power range in an output stage for minimized power consumption in a display driver.

2. Background of the Invention

In general, a display device includes a display driver for driving a display panel, such as a liquid crystal display (LCD) panel. With diverse user demand for various-sized display devices, small sized display panels, medium sized display panels, large-sized display panels, and even super large sized display panels have been placed on the market.

FIG. 1 is a block diagram of a general display device including a display driver 110 and a display panel 120. Referring to FIG. 1, the display driver 110 includes a plurality of level shifters LS1, LS2, LS3, . . . , a plurality of digital to analog converters DAC1, DAC2, DAC3, . . . , and a plurality of buffer amplifiers BUF1, BUF2, BUF3, . . . . A respective level shifter, a respective digital to analog converter, and a respective buffer amplifier form each data path for generating a respective output signal from a respective input digital data signal for driving a respective data line of the display panel 120.

For example, the level shifter LS1, the digital to analog converter DAC1, and the buffer amplifier BUF1 form a path for driving a first data line (not shown) of the display panel 120 with the output signal Vout1 generated from the input digital data signal Data1. Similarly, the level shifter LS2, the digital to analog converter DAC2, and the buffer amplifier BUF2 form a path for driving a second data line (not shown) of the display panel 120 with the output signal Vout2 generated from the input digital data signal Data2. Also, the level shifter LS3, the digital to analog converter DAC3, and the buffer amplifier BUF3 form a path for driving a third data line (not shown) of the display panel 120 with the output signal Vout3 generated from the input digital data signal Data3.

Each of the level shifters LS1, LS2, and LS3 shifts a respective voltage level of a respective one of the input digital data signals Data1, Data2, and Data3. Each of the digital to analog converters DAC1, DAC2, and DAC3 converts a respective shifted digital data signal into a respective one of analog data signals Vin1, Vin2, and Vin3. Each of the buffer amplifiers BUF1, BUF2, and BUF3 receives a respective one of the analog data signals Vin1, Vin2, and Vin3 from the digital to analog converters DAC1, DAC2, and DAC3. Also, each of the buffer amplifiers BUF1, BUF2, and BUF3 generates a respective one of the output signals Vout1, Vout2, and Vout3 corresponding to a respective one of the input signals Vin1, Vin2, and Vin3.

A high power voltage VDD and a low power voltage VSS are applied to each of the buffer amplifiers BUF1, BUF2, and BUF3 that directly drive the display panel 120. The larger the size of the display panel 120, the greater the driving burden of the buffer amplifiers BUF1, BUF2, and BUF3, and the more power consumed by the buffer amplifiers BUF1, BUF2, and BUF3. An increase in power consumption which causes an increase in a calorific value is a significant design constraint of a display driver.

SUMMARY OF THE INVENTION

Accordingly, a buffer amplifier according to an aspect of the present invention includes an output stage with reduced power range for reduced power consumption with minimized deterioration of offset. Such a buffer amplifier includes an input stage and an output stage. The input stage has input high and low power voltages applied thereon for generating at least one transmission signal from an input signal. The output stage has output high and low power voltages applied thereon for generating an output signal from the at least one transmission signal. A first difference between the output high and low power voltages is less than a second difference between the input high and low power voltages.

In an embodiment of the present invention, the output high power voltage is lower than the input high power voltage, and the output low power voltage is higher than the input low power voltage. In another embodiment of the present invention, the output low power voltage is higher than the input low power voltage when the output high power voltage is substantially equal to the input high power voltage. Alternatively, the output high power voltage is lower than the input high power voltage when the output low power voltage is substantially equal to the input low power voltage.

In a further embodiment of the present invention, the output high power voltage is set according to a maximum of the output signal, and the output low power voltage is set according to a minimum of the output signal. In addition, the input high and low power voltages are set for having a low offset of the buffer amplifier for a wide range of the input signal.

In an example embodiment of the present invention, the input stage generates the at least one transmission signal by differentially amplifying the input signal with a rail-to-rail method.

In another embodiment of the present invention, the output stage includes at least one current mirror unit, a bias controller, and an output unit. The current mirror unit has at least one of the output high and low power voltages applied thereon for performing current mirroring in response to the at least one transmission signal. The bias controller is coupled to the current mirror unit for controlling the current mirroring in response to a control signal. The output unit has the output high and low power voltages applied thereon, is coupled to the current mirror unit and the bias controller, and generates the output signal.

A buffer amplifier according to another embodiment of the present invention includes an input stage having one of an input high power voltage or an input low power voltage applied thereon for generating at least one transmission signal from an input signal. In that case, the buffer amplifier also includes an output stage having output high and low power voltages applied thereon for generating an output signal from the at least one transmission signal. The output high power voltage is lower than the input high power voltage if the input high power voltage is applied on the input stage. Alternatively, the output low power voltage is higher than the input low power voltage if the input low power voltage is applied on the input stage.

In an example embodiment of the present invention, the output signal from such a buffer amplifier is applied on a data line of a display panel.

A display driver according to another aspect of the present invention includes a level shifter, a digital to analog converter, and a buffer amplifier. The level shifter shifts a voltage level of a digital data signal to generate a shifted digital data signal. The digital to analog converter converts the shifted digital data signal into an analog data signal. The buffer amplifier receives the analog data signal as an input signal, and the buffer amplifier includes an input stage and an output stage. The input stage has input high and low power voltages applied thereon for generating at least one transmission signal from the input signal. The output stage has output high and low power voltages applied thereon for generating an output signal from the at least one transmission signal. A first difference between the output high and low power voltages is less than a second difference between the input high and low power voltages.

A display driver according to another aspect of the present invention includes a first buffer and a second buffer. The first buffer amplifier includes a first input stage and a first output stage. The first input stage has high and low power voltages applied thereon. The first output stage has the high power voltage applied thereon, and has one of the low power voltage or a first reference power voltage higher than the low power voltage. The second buffer amplifier includes a second input stage and a second output stage. The second input stage has the high and low power voltages applied thereon. The second output stage has the low power voltage applied thereon, and has one of the high power voltage or a second reference power voltage lower than the high power voltage. At least one of the-first and second output stages has at least one of the first and second reference power voltages.

In a further embodiment of the present invention, the display driver further includes a switching network for alternating connection of outputs of the first and second output stages between first and second data lines of a display panel according to polarity inversion. Also, the switching network alternates application of first and second input signals to the first and second input stages according to polarity inversion.

In an example embodiment of the present invention, the first reference power voltage higher than the low power voltage is applied on the first output stage, and the second reference power voltage lower than the high power voltage is applied on the second output stage.

In another embodiment of the present invention, the low power voltage is applied on the first output stage, and the second reference power voltage lower than the high power voltage is applied on the second output stage. Alternatively, the first reference power voltage higher than the low power voltage is applied on the first output stage, and the high power voltage is applied on the second output stage.

In a further embodiment of the present invention, the first reference power voltage corresponds to a minimum of a first output signal generated by the first buffer amplifier, and the second reference power voltage corresponds to a maximum of a second output signal generated by the second buffer amplifier. For example, the minimum of the first output signal and the maximum of the second output signal correspond to a common voltage applied to a common electrode of the display panel.

In another embodiment of the present invention, at least one of the first and second output stages includes a field effect transistor having source and body regions formed in a local well with an intermediate well disposed between the local well and a substrate, with one of the first and second reference power voltages applied on the source and body regions, and with one of the high and low power voltages applied on the substrate.

In this manner, the range between the output high and low power voltages applied at the output stage of the buffer amplifier is reduced for minimizing power consumption in the buffer amplifier. In addition, the range between the input high and low power voltages applied at the input stage is not reduced for preserving the integrity of the offset characteristics of the buffer amplifier.

BRIEF DESCRIPTION OF THE DRAWINGS

The above and other features and advantages of the present invention will become more apparent when described in detailed exemplary embodiments thereof with reference to the attached drawings in which.

DETAILED DESCRIPTION OF THE INVENTION

Figure 11:
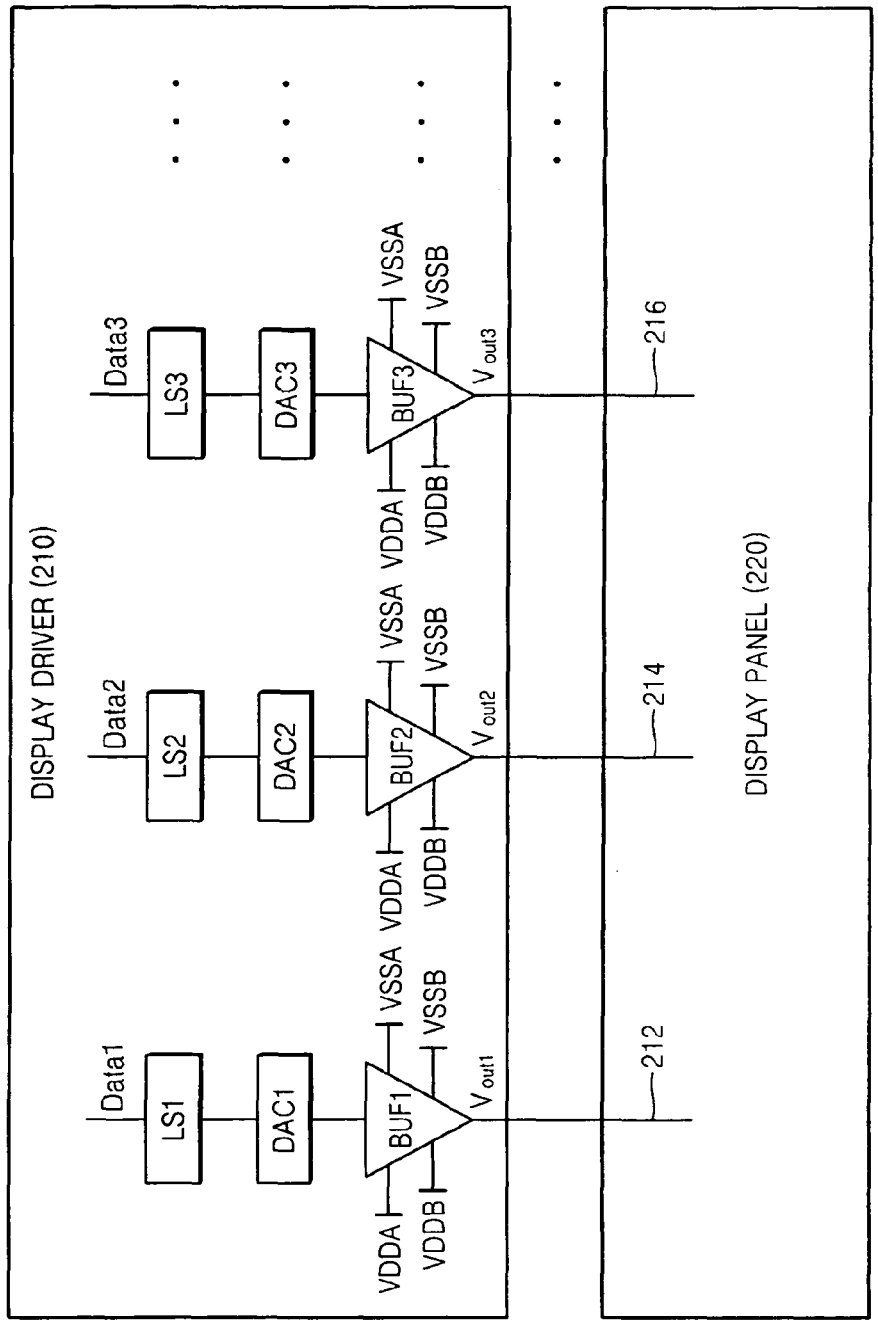
FIG. 11 shows a block diagram of a display device with buffer amplifiers having minimized power consumption, according to an embodiment of the present invention.

FIG. 11 shows a display device 200 having a display driver 210 for driving a display panel 220 such as a LCD (liquid crystal display) panel for example with reduced power consumption, according to an example embodiment of the present invention. The display driver 210 includes a plurality of level shifters, LS1, LS2, LS3, . . . , a plurality of digital to analog converters DAC1, DAC2, DAC3, . . . , and a plurality of buffer amplifiers BUF1, BUF2, BUF3 . . . , each buffer amplifier operating with reduced power consumption.

Each of the levels shifters LS1, LS2, LS3, . . . shifts the voltage level of a respective one of input digital data signals Data1, Data2, Data3, . . . to generate a respective level shifted digital data signal. The digital to analog converters DAC1, DAC2, DAC3, . . . convert the respective level shifted digital data signals to analog signals that are input to the respective buffer amplifiers BUF1, BUF2, BUF3 . . . that amplify the respective analog signals to generate respective output signals Vout1, Vout2, Vout3, . . . applied on respective data lines 212, 214, 216, . . . of the display panel 220.

Each of the plurality of data lines 212, 214, 216, . . . corresponds to a respective level shifter, a respective digital to analog converter, and a respective buffer amplifier for generating a respective output signal applied thereon. For example, the level shifter LS1, the digital to analog converter DAC1, and the buffer amplifier BUF1 generate the output signal Vout1 applied on the data line 212 from the input digital data signal Data1.

Similarly, the level shifter LS2, the digital to analog converter DAC2, and the buffer amplifier BUF2 generate the output signal Vout2 applied on the data line 214 from the input digital data signal Data2. Also, the level shifter LS3, the digital to analog converter DAC3, and the buffer amplifier BUF3 generate the output signal Vout3 applied on the data line 216 from the input digital data signal Data3. Each of the buffers amplifiers BUF1, BUF2, BUF3 . . . has reduced power consumption by being implemented similarly as a buffer amplifier BUF_P illustrated in FIG. 4, according to an embodiment of the present invention.

Figure 1:
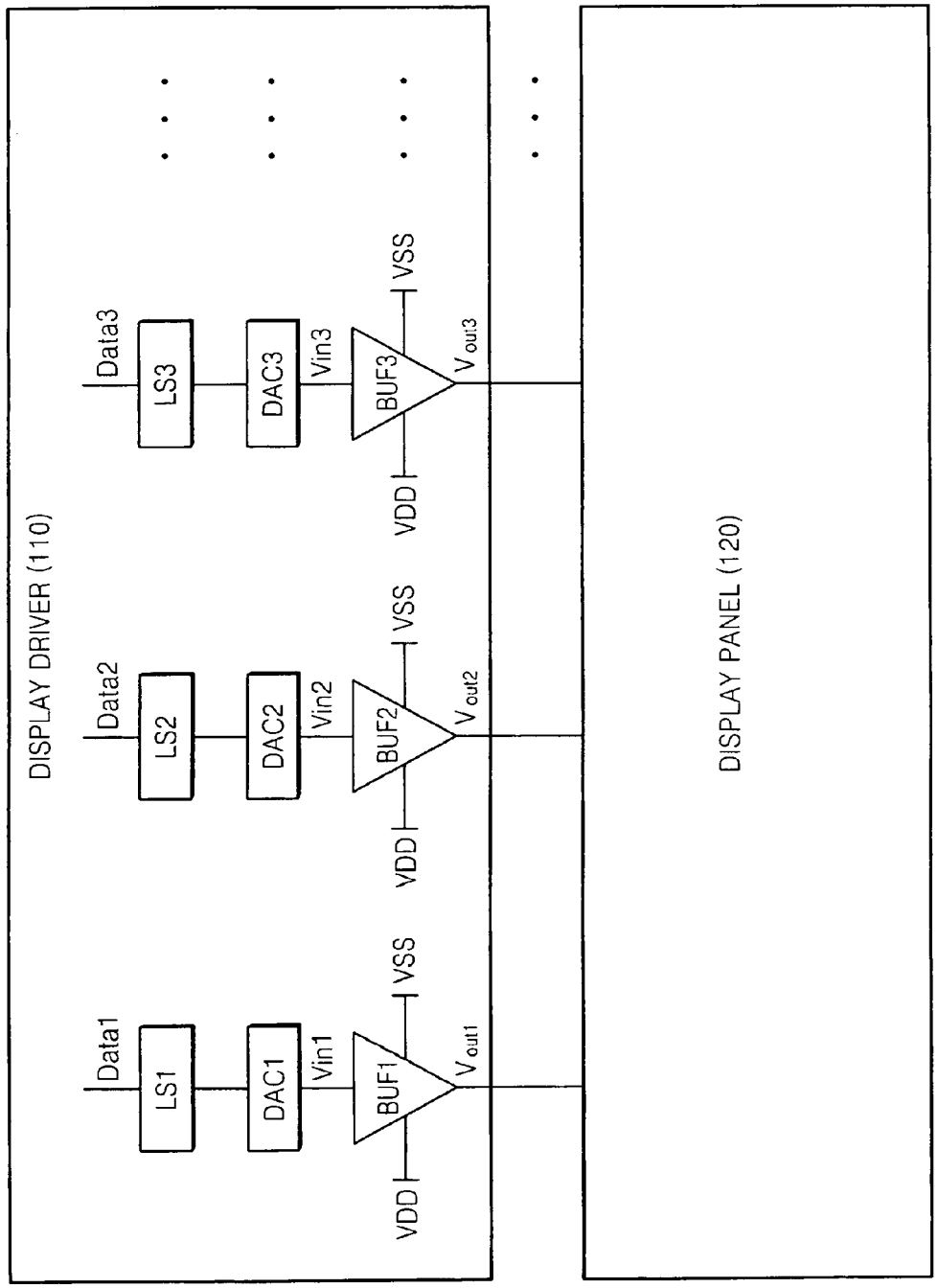
FIG. 1 is a block diagram of a general display device.
Figure 2A:
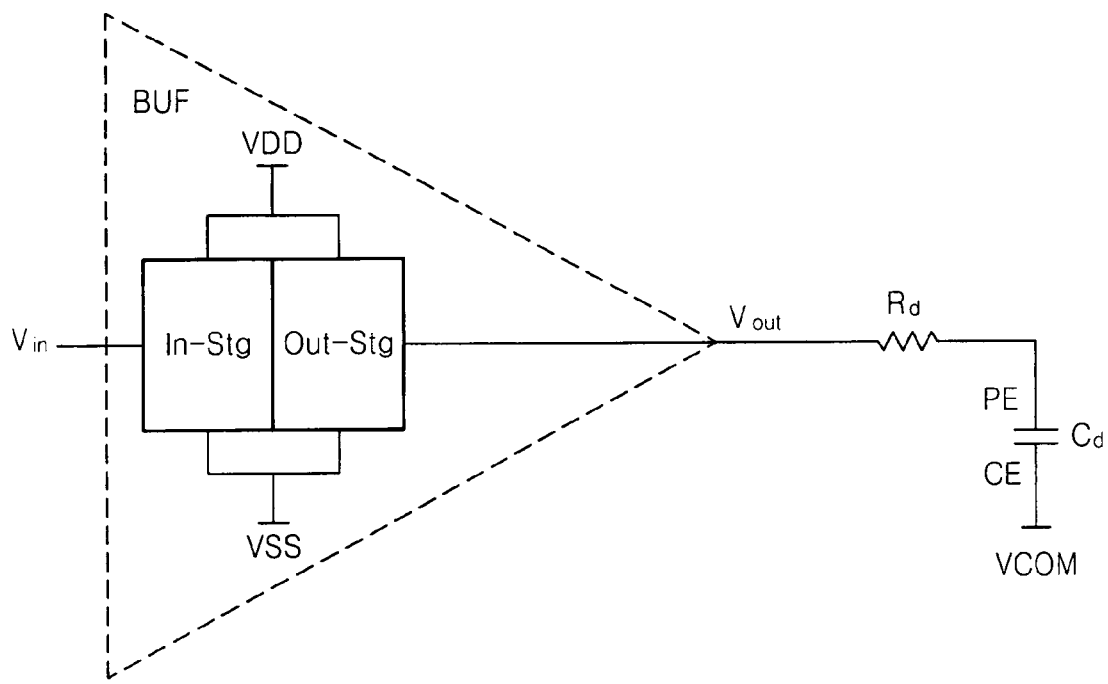
FIG. 2A is a block diagram of a buffer amplifier included in a display driver.
Figure 2B:
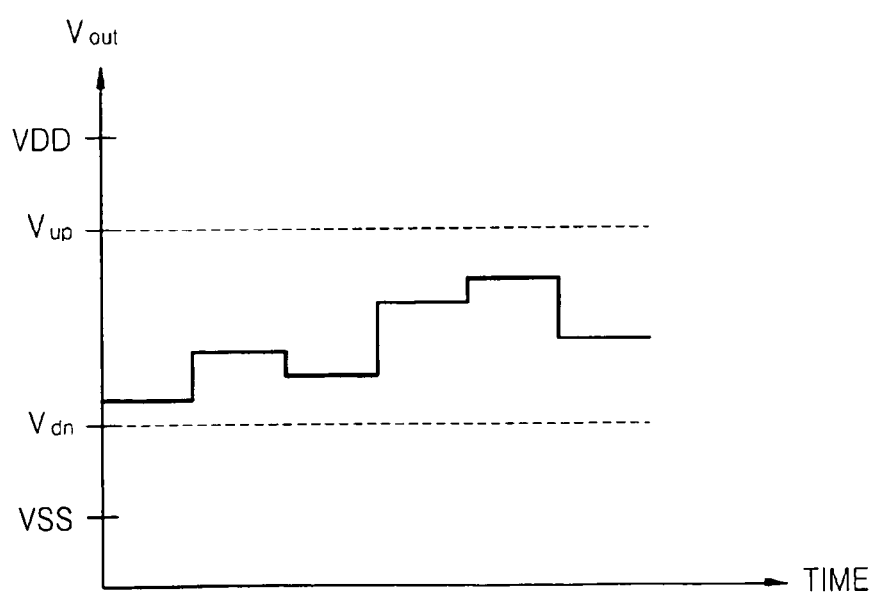
FIG. 2B illustrates an output signal generated by the buffer amplifier of FIG. 2A.

FIG. 2A is a block diagram of a buffer amplifier BUF, and FIG. 2B illustrates an output signal Vout generated by the buffer amplifier BUF of FIG. 2A. The buffer amplifier BUF generates the output signal Vout corresponding to an input signal Vin. Referring to FIG. 2A, the buffer amplifier BUF drives a load such as the display panel 120 that is modeled as a load resistor Rd and a load capacitor Cd. For example, a cell capacitor of a pixel circuit of a liquid crystal display (LCD) panel corresponds to the load capacitor Cd. In that case, the output signal Vout generated from the buffer amplifier BUF is applied to a pixel electrode PE of the cell capacitor Cd via the load resistor Rd, and a common voltage VCOM is applied to a common electrode CE of the cell capacitor Cd.

Further referring to FIG. 2A, the buffer amplifier BUF is divided into an input stage In-Stg and an output stage Out-Stg that form a signal path between terminals for the input signal Vin and the output signal Vout. As illustrated in FIG. 2A, a high power voltage VDD and a low power voltage VSS are applied to both the input stage In-Stg and the output stage Out-Stg for powering the input and output stages In-Stg and Out-Stg.

Referring to FIG. 2B, the high power voltage VDD and the low power voltage VSS are applied to the output stage Out-Stg, but the voltage of the output signal Vout generated from the output stage Out-Stg is within a range between a maximum voltage Vup and a minimum voltage Vdn. The output signal Vout has a voltage corresponding to a voltage of the input signal Vin, with the output signal Vout being within the range between the voltages Vup and Vdn.

The high power voltage VDD is set to be higher than the maximum voltage Vup, and the low power voltage VSS is set to be lower than the minimum voltage Vdn, in consideration of operating characteristics of transistors included in the output stage Out-Stg such as a threshold voltage, a drain-to-source voltage (overdrive voltage), etc. of such transistors. However, if the high power voltage VDD is set to be higher than needed or the low power voltage VSS is set to be lower than needed, power is unnecessarily consumed.

On the other hand, the high power voltage VDD should not be lower than needed, and the low power voltage VSS should not be higher than needed. In addition, an offset characteristic and an effective input/output range of the buffer amplifier BUF is desired to not be deteriorated even with reduction of power consumption. The offset characteristic and effective input/output range of the buffer amplifier BUF is now described with reference to FIGS. 3 and 4.

Figure 3:
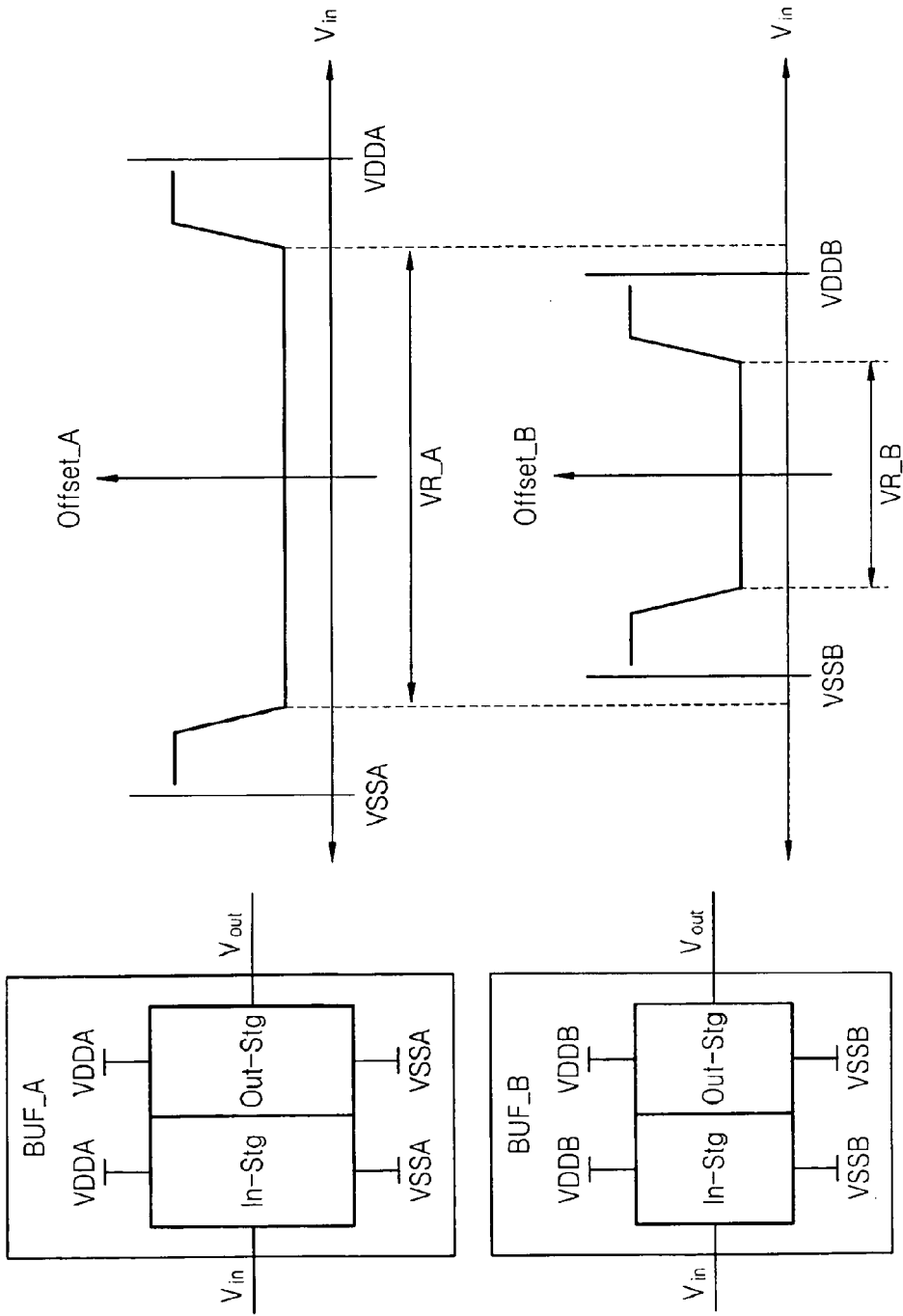
FIG. 3 illustrates a relationship between a range of power voltages and an offset of a buffer amplifier.

FIG. 3 illustrates the relationship between the power voltages and an offset of a buffer amplifier. Referring to FIG. 3, a first buffer amplifier BUF_A generates an output signal Vout corresponding to an input signal Vin. In addition, a first high power voltage VDDA and a first low power voltage VSSA are applied to an input stage In-Stg and an output stage Out-Stg of the first buffer amplifier BUF_A.

The first buffer amplifier BUF_A has a first effective input/output range VR_A wherein a first offset Offset_A of the first buffer amplifier BUF_A in response to the input signal Vin is small. However, outside the first effective input/output range VR_A, the first offset Offset_A of the first buffer amplifier BUF_A is significantly higher.

Also referring to FIG. 3, a second buffer amplifier BUF-B generates an output signal Vout corresponding to an input signal Vin. For reducing power consumption, a second high power voltage VDDB lower than the first high power voltage VDDA and a second low power voltage VSSB higher than the first low power voltage VSSA are applied to an input stage In-Stg and an output stage Out-Stg of the second buffer amplifier BUF_B. Thus, a first difference between the first high and low power voltages VDDA−VSSA is higher than a second difference between the second high and low power voltages VDDB−VSSB.

In that case, the second buffer amplifier BUF_B has a second effective input/output range VR_B that is less than the first effective input/output range VR_A. Thus, the offset of the second buffer amplifier BUF_B is relatively small for a smaller effective input/output range VR_B.

Figure 4:
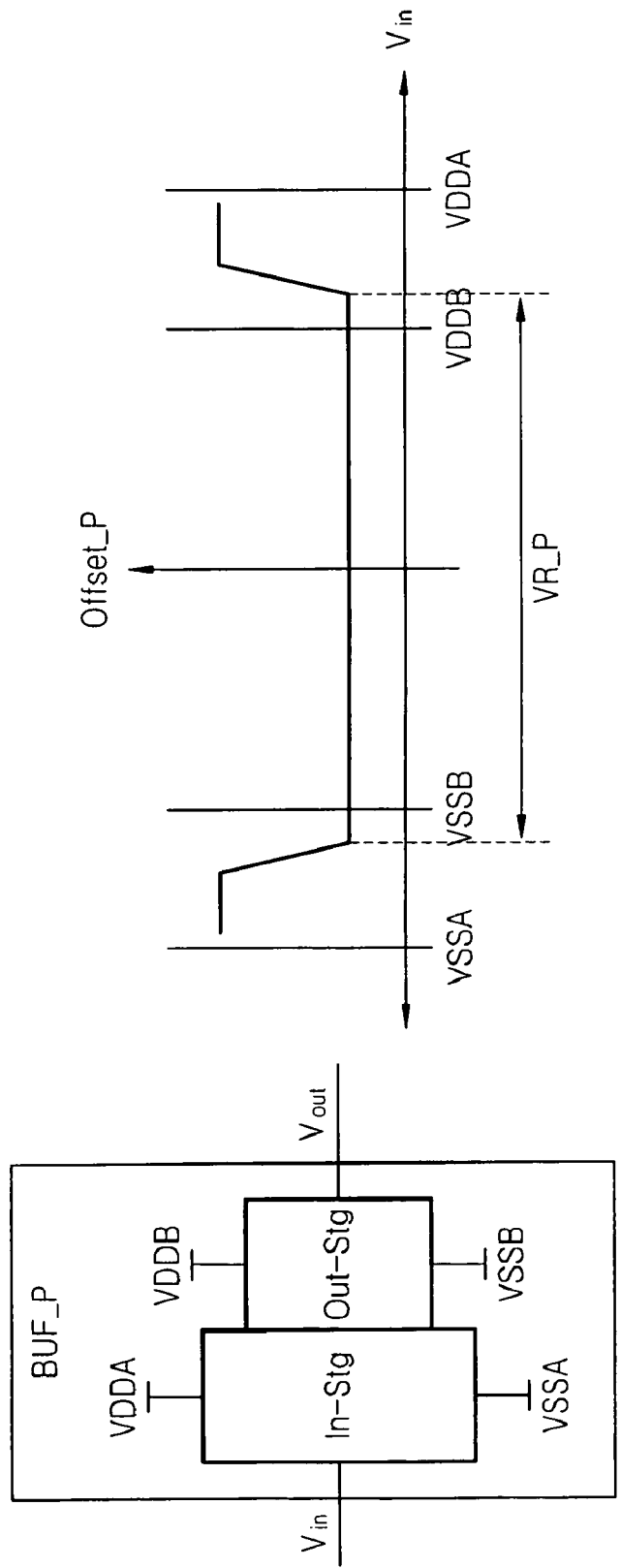
FIG. 4 illustrates a relationship between a range of power voltages and an offset of a buffer amplifier with minimized power consumption, according to an embodiment of the present invention.

FIG. 4 illustrates the relationship between power voltages and an offset of a buffer amplifier BUF_P with reduced power consumption, according to an embodiment of the present invention. Each of the buffers amplifiers BUF1, BUF2, BUF3 . . . of FIG. 11 may be implemented similarly as the buffer amplifier BUF_P of FIG. 4, according to an embodiment of the present invention.

In the buffer amplifier BUF_P of FIG. 4, an input high power voltage VDDA and an input low power voltage VSSA are applied to the input stage In-Stg. In contrast, an output high power voltage VDDB and an output low power voltage VSSB are applied to the output stage Out-Stg of the buffer amplifier BUF_P. In the buffer amplifier BUF_P of FIG. 4, a first difference VDDB−VSSB between the output high and low power voltage VDDB and VSSB is less than a second difference VDDA−VSSA between the input high and low power voltages VDDA and VSSA such that power consumption at the output stage Out-Stg is lowered.

Moreover in FIG. 4, the buffer amplifier BUF_P has an effective input/output range VR-P wherein an offset of the buffer amplifier BUF_P is relatively low. Such an effective input/output range VR_P is not decreased significantly because the difference VDDA−VSSA between the input high and low power voltages VDDA and VSSA applied to the input stage In-Stg is maintained to be relatively high. The endpoints between the effective input/output range VR_P are higher than the output high power voltage VDDB, and lower than the output low power voltage VSSB. The offset of the buffer amplifier BUF_P is determined mainly by the difference between the input high and low power voltages VDDA and VSSA applied to the input stage In-Stg.

Figure 5:
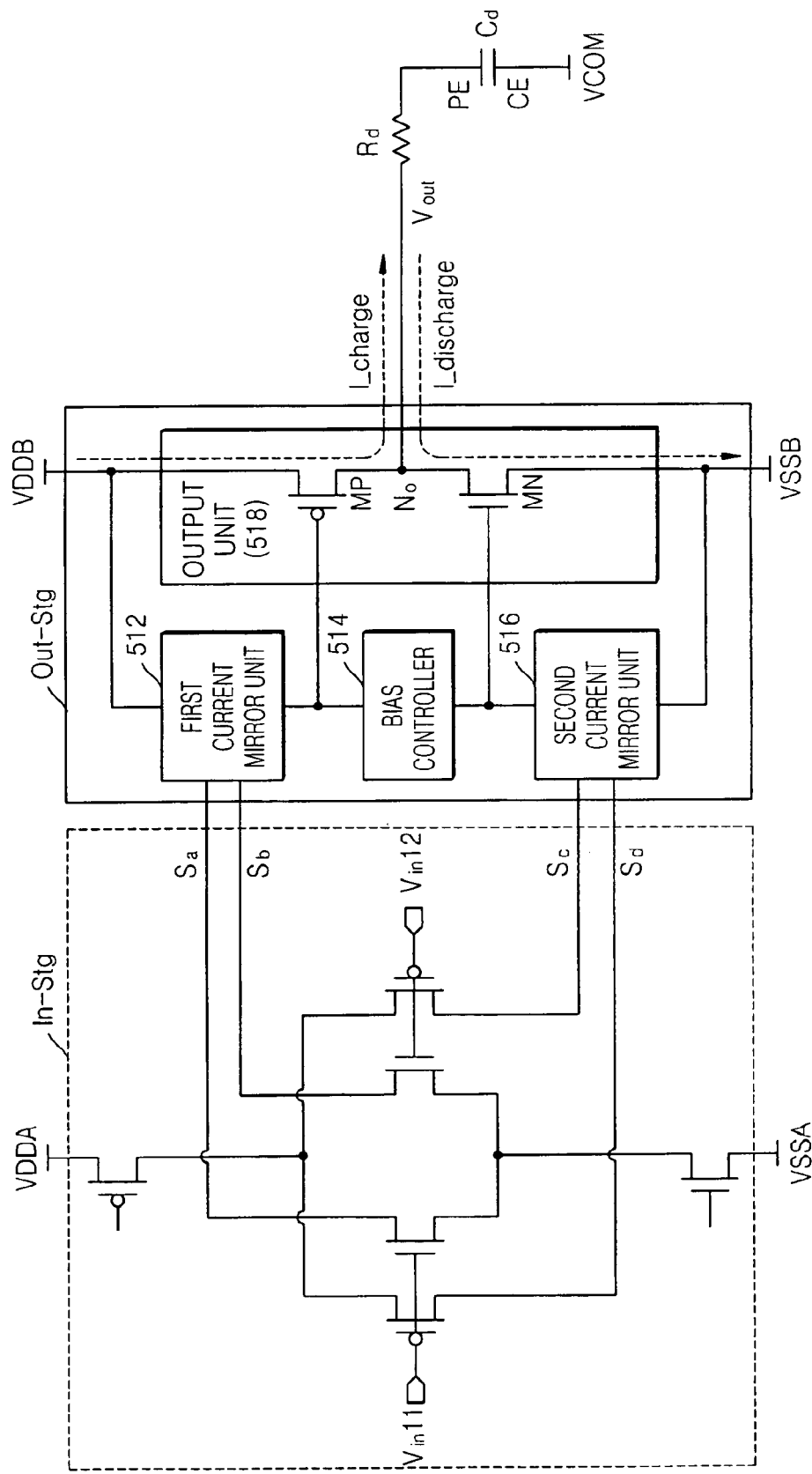
FIG. 5 shows a circuit diagram and a block diagram of components in more detail for the buffer amplifier of FIG. 4, according to an embodiment of the present invention.

FIG. 5 is a circuit diagram of the buffer amplifier BUF_P of FIG. 4, according to an example embodiment of the present invention with the input stage In-Stg and the output stage Out-Stg for driving a load resistor Rd and a load capacitor Cd.

The input stage In-Stg has the input high and low power voltages VDDA and VSSA applied thereon for generating transmission signals Sa, Sb, Sc, and Sd corresponding to input signals Vin1 1 and Vin1 2. The output stage Out-Stg has the output high and low power voltages VDDB and VSSB applied thereon for generating the output signal Vout corresponding to the transmission signals Sa, Sb, Sc, and Sd. The first difference VDDB−VSSB between the output high and low power voltage VDDB and VSSB is less than the second difference VDDA−VSSA between the input high and low power voltages VDDA and VSSA for reduced power consumption at the output stage Out-Stg.

According to an example embodiment of the present invention, the output high power voltage VDDB is set to be lower than the input high power voltage VDDA, and the output low power voltage VSSB is set to be higher than the input low power voltage VSSA. Alternatively, when the output high power voltage VDDB is set to be equal to the input high power voltage VDDA, the output low power voltage VSSB is set to be higher than the input low power voltage VSSA. Similarly, when the output low power voltage VSSB is set to be equal to the input low power voltage VSSA, the output high power voltage VDDB is set to be lower than the input high power voltage VDDA.

Power consumed by the buffer amplifier BUF_P is categorized into static power consumed by the input stage In-Stg and dynamic power consumed by the output stage Out-Stg. Such static power is consumed by the input stage In-Stg to generate the transmission signals Sa, Sb, Sc, and Sd corresponding to the input signals Vin11 and Vin12. Such dynamic power is consumed by the output stage Out-Stg to drive the load resistor Rd and the load capacitor Cd for generating the output signal Vout from the transmission signals Sa, Sb, Sc, and Sd.

Most of the power consumed by the buffer amplifier BUF_P is used for driving the load resistor Rd and the load capacitor Cd. Thus, the power consumed by the buffer amplifier BUF_P is significantly reduced by reducing the dynamic power consumption at the output stage Out-Stg.

The output high power voltage VDDB is set in consideration of a maximum of the output signal Vout, and the output low power voltage VSSB is set in consideration of a minimum of the output signal Vout. In detail, the output high power voltage VDDB is set to be slightly higher than the maximum of the output signal Vout, and the output low power voltage VSSB is set to be slightly lower than the minimum of the output signal Vout, in consideration of the operating characteristics of the transistors, such as threshold voltages and drain-to-source voltages (overdrive voltages) of a PMOSFET (P-channel metal oxide semiconductor field effect transistor) MP and an NMOSFET (N-channel metal oxide semiconductor field effect transistor) coupled to an output node No having the output voltage Vout generated thereon in FIG. 5.

The input stage In-Stg of the buffer amplifier BUF_P in FIG. 5 includes differentially coupled PMOSFETs and differentially coupled NMOSFETs with gates having the input signals Vin11 and Vin12 applied thereon. The drains of the differentially coupled NMOSFETs generate the transmission signals Sa and Sb, and the drains of the differentially coupled PMOSFETs generate the transmission signals Sc and Sd. A bias PMOSFET has the input high power voltage VDDA applied thereon, and a bias NMOSFET has the input low power voltage VSSA applied thereon. The input stage In-Stg of FIG. 5 differentially amplifies the input signals Vin11 and Vin12 according to a rail-to-rail method to be later described in more detail with reference to FIGS. 6A, 6B, and 6C.

Further referring to FIG. 5, the output stage Out-Stg includes a first current mirror unit 512, a bias controller 514, a second current mirror unit 516, and an output unit 518. The output high power voltage VDDB is applied on the first current mirror unit 512 and the PMOSFET MP of the output unit 518. The output low power voltage VDDS is applied on the second current mirror unit 516 and the NMOSFET MN of the output unit 518.

The first current mirror unit 512 performs current mirroring in response to the transmission signals Sa and Sb. The second current mirror unit 516 performs current mirroring in response to the transmission signals Sc and Sd. The bias controller 514 is connected to the first and second current mirror units 512 and 516 for controlling current mirroring therein in response to a control signal (not shown). The output unit 518 is connected to the current mirror units 512 and 516 and the bias controller 514 for generating the output signal Vout in response to the current mirroring by the first and second current mirror units 512 and 516.

When the output stage Out-Stg charges the load capacitor Cd with a driving current I_charge corresponding to the output signal Vout, a path of the driving current I_charge is formed from the terminal of the output high power voltage VDDB to the load capacitor Cd via the PMOSFET MP and the load resistor Rd. When the output stage Out-Stg discharges the load capacitor Cd with a driving current I_discharge corresponding to the output signal Vout, a path of the driving current I_discharge is formed from the load capacitor Cd to the terminal of the output low power voltage VSSB via the load resistor Rd and the NMOSFET MN. The load capacitor Cd may correspond to a cell capacitor included in a pixel circuit of the display panel 220 such as an LCD (liquid crystal display) panel. The cell capacitor Cd includes a pixel electrode PE and a common electrode CE.

Figure 6A:
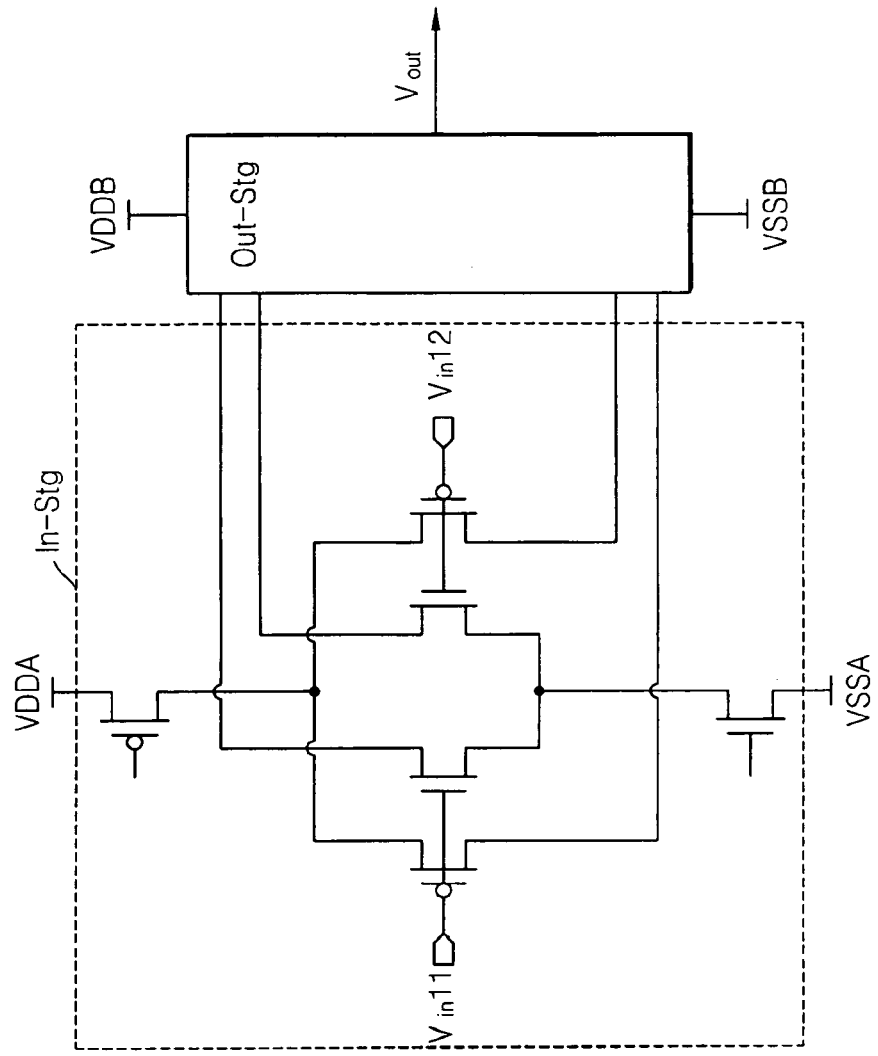
FIGS. 6A, 6B, and 6C are circuit diagrams of various types of an input stage included in the buffer amplifier of FIG. 4, according to embodiments of the present invention.
Figure 6A:
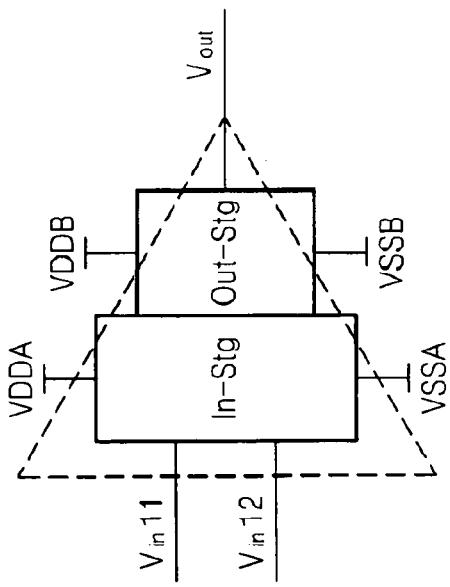
Figure 6B:
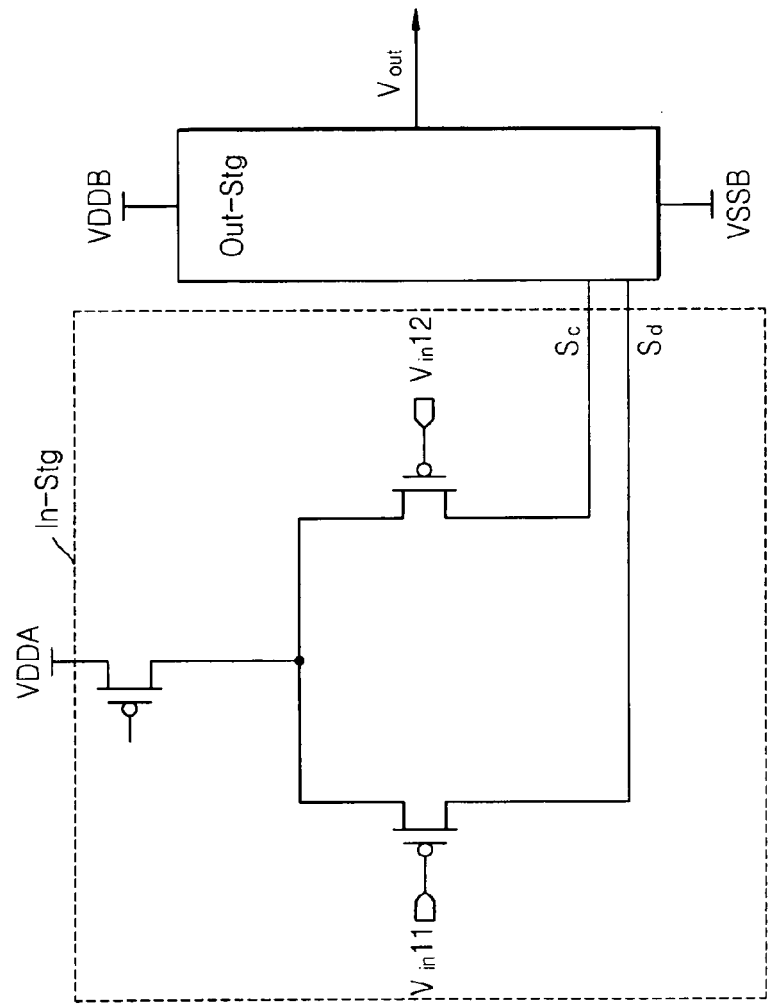
Figure 6B:
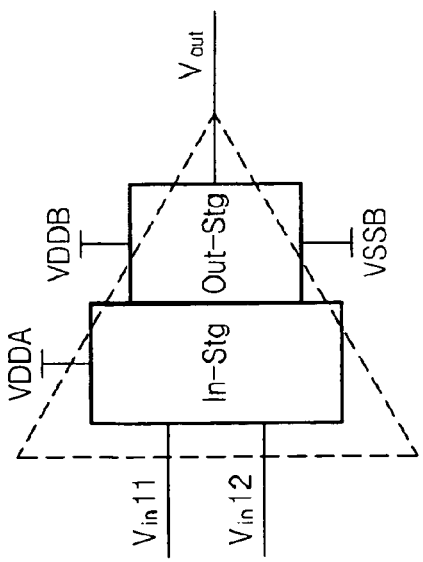
Figure 6C:
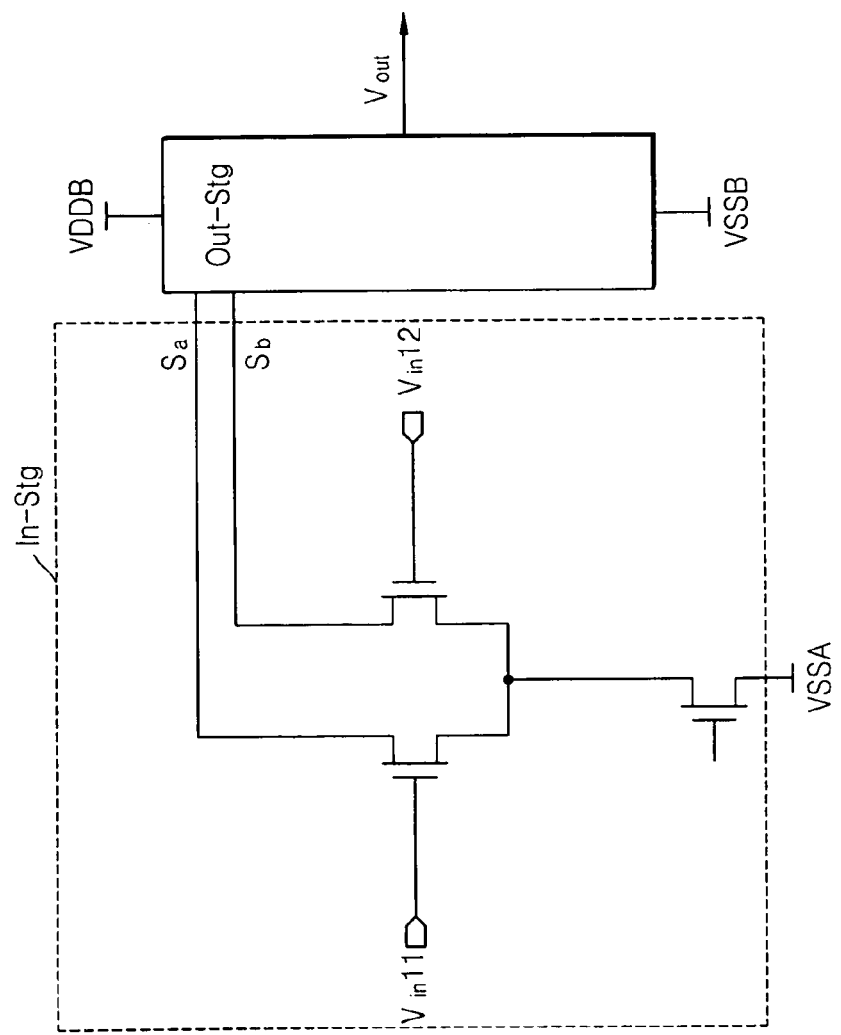
Figure 6C:
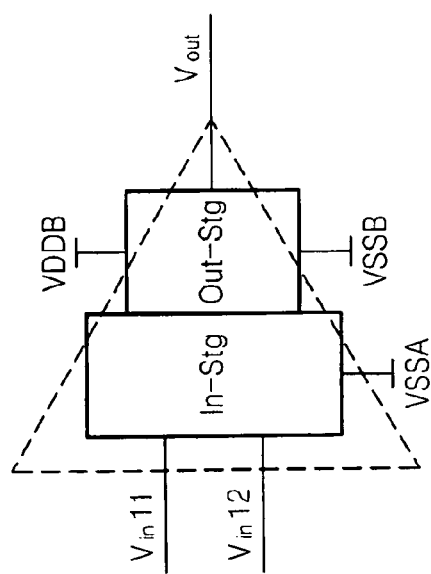

FIGS. 6A, 6B, and 6C are circuit diagrams of various types of the input stage In-Stg which may be used in the buffer amplifier according to embodiments of the present invention. The input stage In-Stg illustrated in FIG. 6A is the same as the input stage In-Stg illustrated in FIG. 5.

In contrast in FIG. 6B, only the input high power voltage VDDA is applied to the input stage In-Stg. Similarly in FIG. 6C, only the input low power voltage VSSA is applied to the input stage In-Stg. In FIGS. 6B and 6C, the effective range of the input signals Vin11 and Vin12 is inclined toward the input high power voltage VDDA or the input low power voltage VSSA, thus reducing the effective input/output range of the buffer amplifiers.

In contrast in FIG. 6A, both the input high and low power voltages VDDA and VSSA are applied to the input stage In-Stg. In that case, the effective range of the input signals Vin1 1 and Vin12 extends from near the input high power voltage VDDA to near the input low power voltage VSSA, thereby increasing the effective input/output range of the buffer amplifier in a rail-to-rail method of amplification. In the rail-to-rail method, VDDA is referred to as a positive rail voltage and VSSA is referred to as a negative rail voltage.

The input stage In-Stg for the rail-to-rail method in FIG. 6A is preferable for the higher effective input/output range of the buffer amplifier. However, the input stages of FIG. 6B and FIG. 6C may also be used for the present invention if some reduction in the effective input/output range is allowable.

Referring to FIG. 6B, the input stage In-Stg has the input high power voltage VDDA applied thereon to generate transmission signals Sc and Sd corresponding to the input signals Vin11 and Vin12. In addition, the output stage Out-Stg has the output high and low power voltages VDDB and VSSB applied thereon to generate the output signal Vout corresponding to the transmission signals Sc and Sd. Further referring to FIG. 6B, for reducing the dynamic power consumption at the output stage Out-Stg, the output high power voltage VDDB is set to be lower than the input high power voltage VDDA.

Referring to FIG. 6C, the input stage In-Stg has the input low power voltage VSSA applied thereon to generate transmission signals Sa and Sb corresponding to the input signals Vin11 and Vin12. In addition, the output stage Out-Stg has the output high and low power voltages VDDB and VSSB applied thereon to generate the output signal Vout corresponding to the transmission signals Sa and Sb. Further referring to FIG. 6C, for reducing dynamic power consumption at the output stage Out-Stg, the output low power voltage VSSB is set to be higher than the input low power voltage VSSA.

Figure 7:
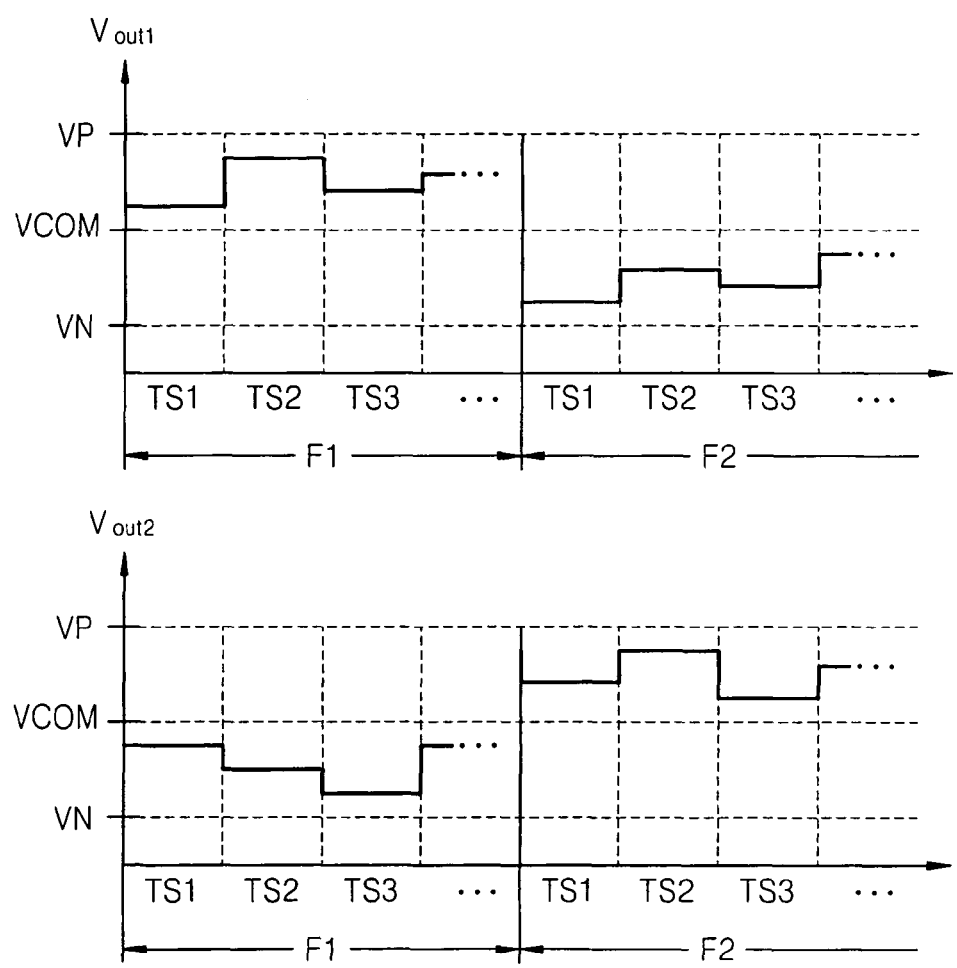
FIG. 7 is a timing diagram illustrating signals driven onto a data line of a display panel according to column inversion.

FIG. 7 is a timing diagram for illustrating a column inversion method (which is also referred to as a 'line inversion method') of driving data lines of a display panel such as a LCD panel by a display driver. The display driver drives the LCD panel with inversion of the polarities (i.e., polarity inversion) of output signals Vout1 and Vout2 every frame for preventing the LCD panel from deteriorating.

For explaining the column inversion method, the display driver is assumed to include a first buffer amplifier that drives a first data line of the LCD panel, and to include a second buffer amplifier that drives a second data line of the LCD panel. A data line of a display panel may also be termed a source line or a column line.

Further referring to FIG. 7, a first output signal Vout1 is generated by the first buffer amplifier for driving the first data line of the LCD panel, and a second output signal Vout2 is generated by the second buffer amplifier for driving the second data line of the LCD panel. In FIG. 7, TS1 denotes a period of driving a first pixel connected to one data line, TS2 denotes a period of driving a second pixel connected to that data line, and TS3 denotes a period of driving a third pixel connected to that data line.

In FIG. 7, VCOM denotes a common voltage applied to a common electrode of a pixel circuit of the LCD panel (see FIG. 5). In addition in FIG. 7, VP denotes a maximum of the output signal Vout1 or Vout2, and VN denotes a minimum of the output signal Vout1 or Vout2.

In a first frame period F1, the voltage level of the first output signal Vout1 is within a positive range from VP to VCOM. In a second frame period F2, the voltage level of the first output signal Vout1 is within a negative range from VCOM to VN. In the first frame period F1, the voltage level of the second output signal Vout2 is within the negative range from VCOM to VN. In the second frame period F2, the voltage level of the second output signal Vout2 is within the positive range from VP to VCOM. As described above, in the column inversion method, the polarities of the output signals Vout1 and Vout2 are alternately inverted every frame or column.

As illustrated in FIG. 7, each of the first and second output signals Vout1 and Vout2 are alternately within both the positive range from VP to VCOM and the negative range from VCOM to VN. When the first output signal Vout1 is within the positive range from VP to VCOM, the second output signal Vout2 is within the negative range from VCOM to VN. Similarly when the first output signal Vout1 is within the negative range from VCOM to VN, the second output signal Vout2 is within the positive range from VP to VCOM.

Thus, the polarities of the ranges of the first and second output signals Vout1 and Vout2 are alternately switched with each other every frame or every predetermined period of driving pixels. In an embodiment of the present invention, power consumption may be reduced in the inversion method as illustrated in FIGS. 8A, 8B, and 8C.

Figure 8A:
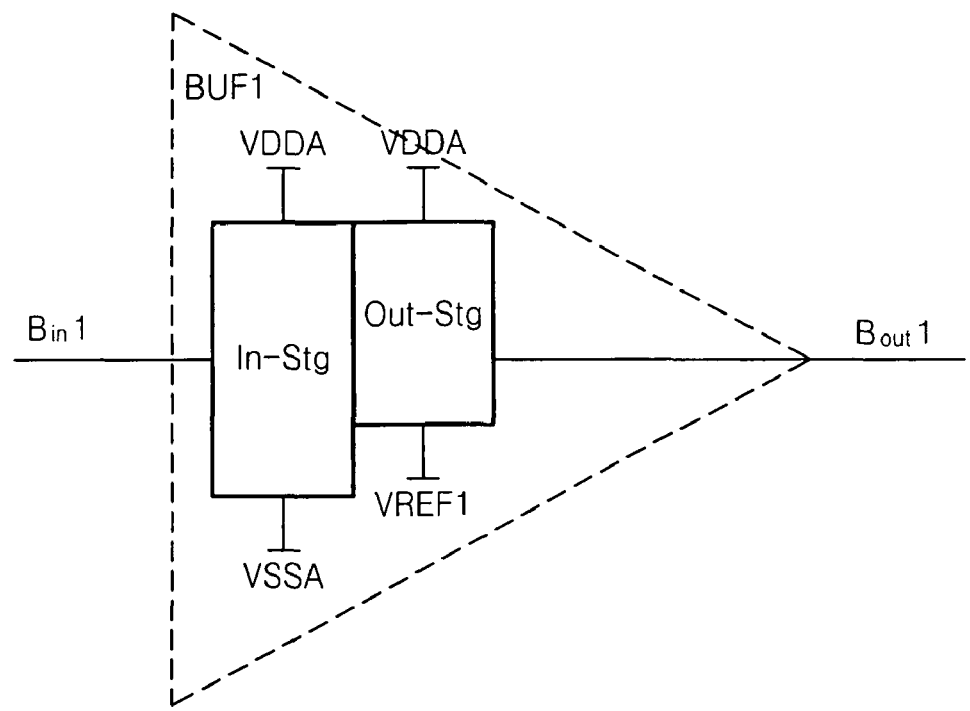
FIGS. 8A, 8B, and 8C are block diagrams of a display driver with multiple buffer amplifiers with minimized power consumption, according to embodiments of the present invention.
Figure 8A:
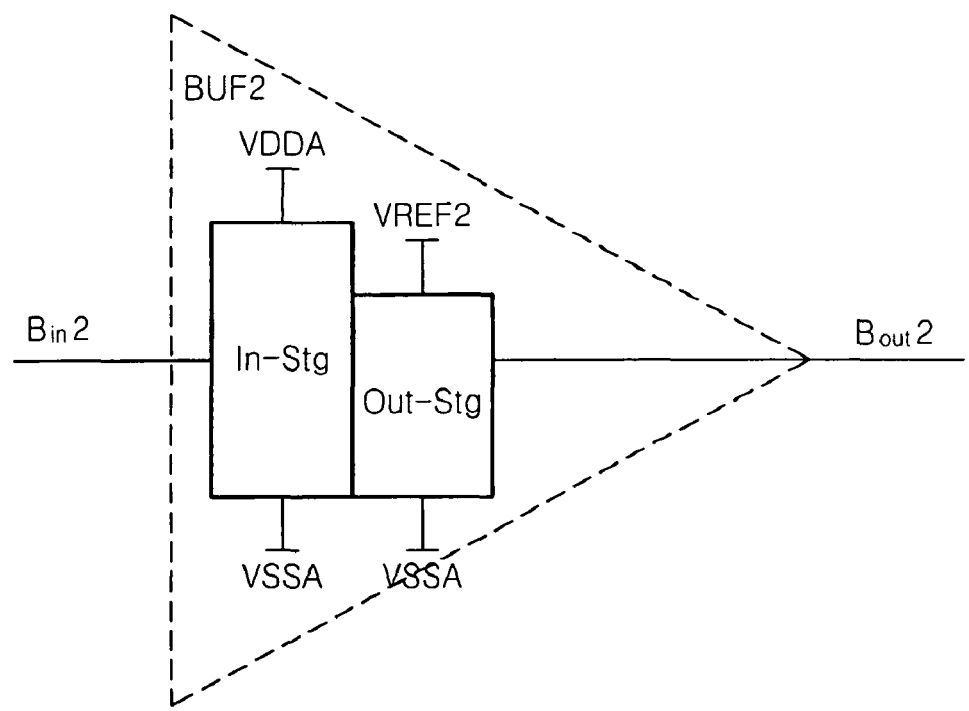
Figure 8B:
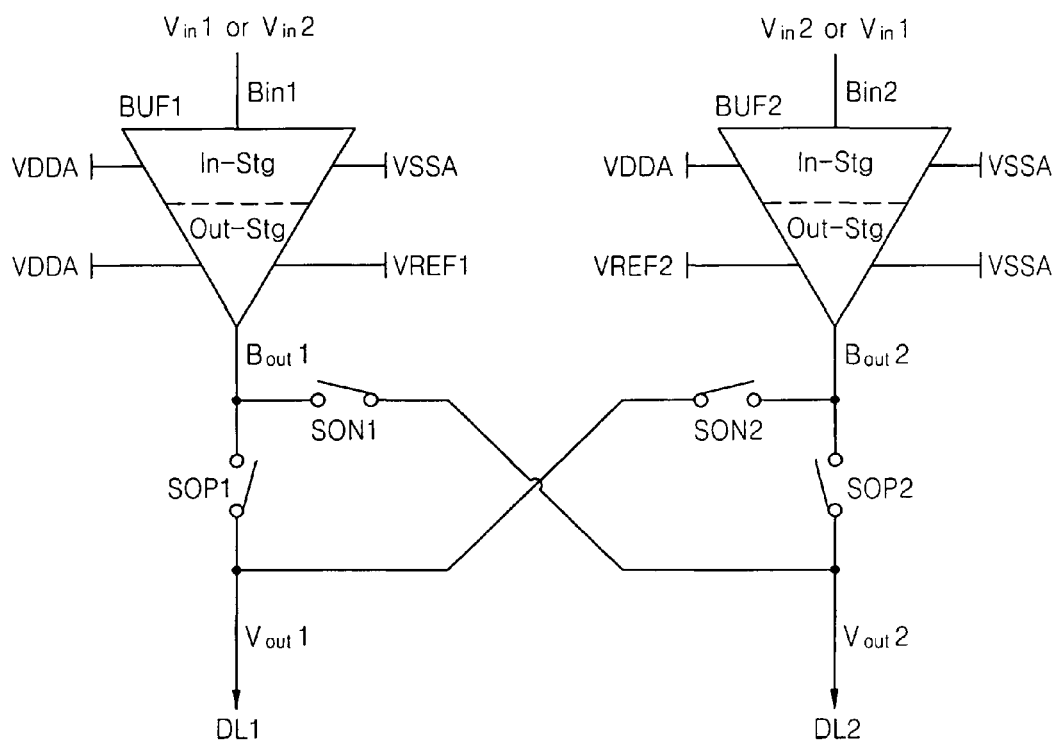
Figure 8C:
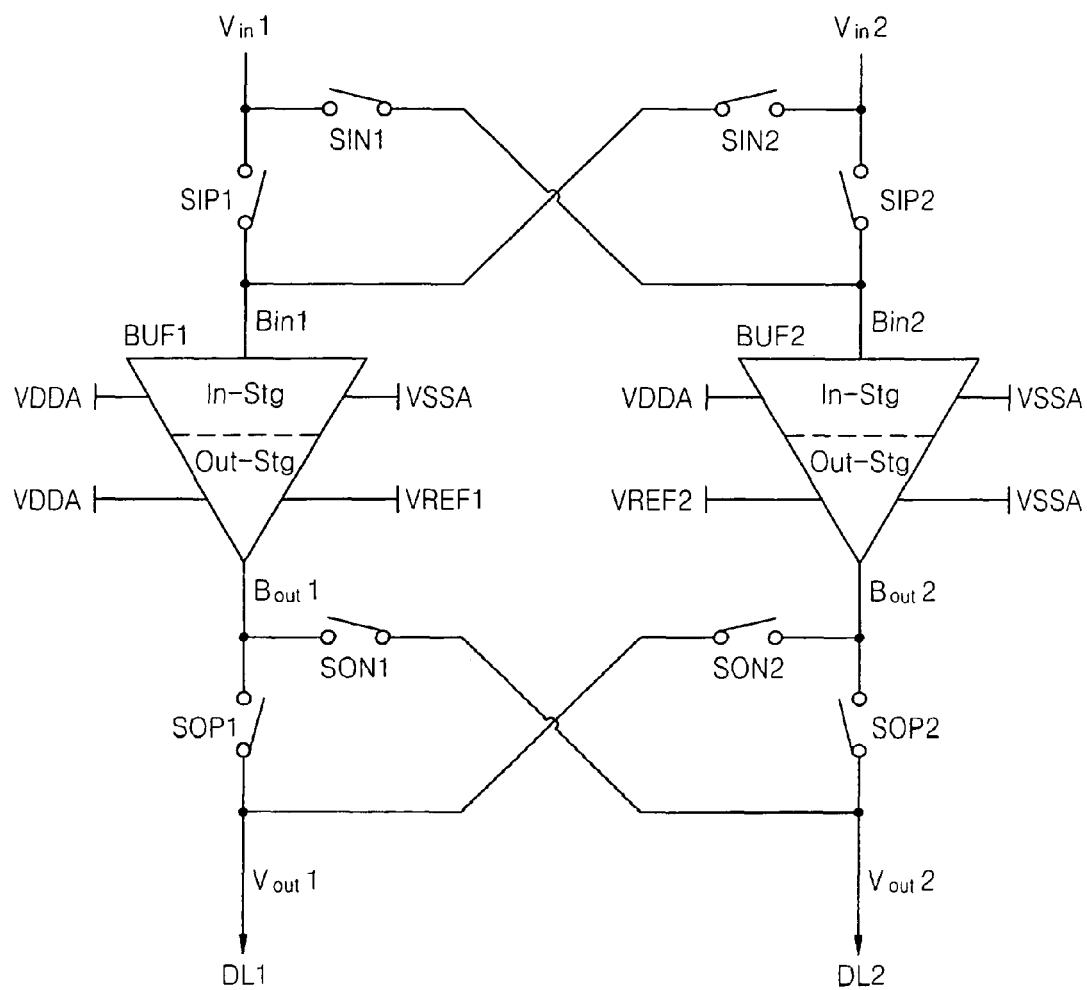

FIGS. 8A, 8B, and 8C are circuit diagrams of a display driver for driving with the inversion method according to an embodiment of the present invention. FIG. 8A illustrates a first buffer amplifier BUF1 that outputs a first output signal Bout1 corresponding to a first input signal Bin1 and a second buffer amplifier BUF2 that outputs a second output signal Bout2 corresponding to a second input signal Bin2. The first and second buffer amplifiers BUF1 and BUF2 are included in a display driver according to an embodiment of the present invention.

A high power voltage VDDA and a low power voltage VSSA are applied to an input stage In-Stg of the first buffer amplifier BUF1. The high power voltage VDDA and a first reference power voltage VREF1 are applied to an output stage Out-Stg of the first buffer amplifier BUF1. For reducing dynamic power consumption at the output stage Out-Stg, the first reference power voltage VREF1 is set to be higher than the low power voltage VSSA. For example, the first buffer amplifier BUF1 is a positive buffer amplifier that generates the output signal Bout1 within the positive range from VP to VCOM, as illustrated in FIG. 7.

The high power voltage VDDA and the low power voltage VSSA are applied to an input stage In-Stg of the second buffer amplifier BUF2. A second reference power voltage VREF2 and the low power voltage VSSA are applied to an output stage Out-Stg of the second buffer amplifier BUF2. For reducing dynamic power consumption at the output stage Out-Stg, the second reference power voltage VREF2 is set to be lower than the high power voltage VDDA. For example, the second buffer amplifier BUF2 is a negative buffer amplifier that generates the output signal Bout2 within the negative range from VCOM to VN, as illustrated in FIG. 7.

In FIG. 8A, the first reference power voltage VREF1 corresponds to a minimum of the first output signal Bout1 from the first buffer amplifier BUF1. The second reference power voltage VREF2 corresponds to a maximum of the second output signal Bout2 from the second buffer amplifier BUF2. For example, when a display driver includes the first and second buffer amplifiers BUF1 and BUF2 for driving an LCD panel, the minimum of the first output signal Bout1 and the maximum of the second output signal Bout2 correspond to the common voltage VCOM applied to a common electrode of a pixel circuit of the LCD panel, as illustrated in FIG. 7.

The first reference power voltage VREF1 is set to be slightly lower than the common voltage VCOM, and the second reference power voltage VREF2 is set to be slightly higher than the common voltage VCOM, in consideration of the operating characteristics such as a threshold voltage, a drain-to-source voltage (overdrive voltage), etc. of transistors, such as the transistors MP and MN in FIG. 5, included in the output stage Out-Stg.

FIGS. 8B and 8C illustrate a switching network with switches SOP1, SOP2, SON1, SON2, SIP1 SIP2, SIN1, and SIN2 for switching the signal paths through the first and second buffer amplifiers BUF1 and BUF2 for the inversion method. Referring to FIGS. 8B and 8C, a first positive output switch SOP1 and a first negative output switch SON1 control the path of the first output signal Bout1. A second positive output switch SOP2 and a second negative output switch SON2 control the path of the second output signal Bout2. Referring to FIG. 8C, a first positive input switch SIP1 and a first negative input switch SIN1 control the path of a first input signal Vin1. A second positive input switch SIP2 and a second negative input switch SIN2 control the path of a second input signal Vin2.

Referring to FIG. 8B, the input stage In-Stg of the first buffer amplifier BUF1 receives one of the input signals Vin1 and Vin2 as its input signal Bin1. The input stage In-Stg of the second buffer amplifier BUF2 receives the other of the input signals Vin2 and Vin1 as its input signal Bin2. For inversion driving, the first and second input signals Vin1 and Vin2 are alternately coupled to the first and second buffer amplifiers BUF1 and BUF2.

A corresponding path of a level shifter and a digital to analog converter may provide each of the first and second input signals Vin1 and Vin2 to each of the buffer amplifiers BUF1 and BUF2. For example, the input switches SIP1, SIN1, SIP2 and SIN2 of FIG. 8C may be included in such level shifters or such digital to analog converters. Alternatively, the input switches SIP1, SIN1, SIP2 and SIN2 may be included between such digital to analog converters and the buffer amplifiers BUF1 and BUF2.

Driving according to the inversion method is now described in more detail with reference to FIG. 8C. The first positive input switch SIP1 transmits the first input signal Vin1 to the input stage In-Stg of the first buffer amplifier BUF1, when a positive inversion signal is activated (not shown). The first negative input switch SIN1 transmits the first input signal Vin1 to the input stage In-Stg of the second buffer amplifier BUF2 when a negative inversion signal is activated (not shown).

The second positive input switch SIP2 transmits the second input signal Vin2 to the input stage In-Stg of the second buffer amplifier BUF2 when the positive inversion signal is activated. The second negative input switch SIN2 transmits the second input signal Vin2 to the input stage In-Stg of the first buffer amplifier BUF1 when the negative inversion signal is activated. One of the positive inversion signal and the negative inversion signal is activated at a time.

The first positive output switch SOP1 transmits the first output signal Bout1 from the output stage Out-Stg of the first buffer amplifier BUF1 to a first data line DL1 of the display panel when the positive inversion signal is activated. The first negative output switch SON1 transmits the first output signal Bout1 from the output stage Out-Stg of the first buffer amplifier BUF1 to a second data line DL2 of the display panel when the negative inversion signal is activated.

The second positive output switch SOP2 transmits the second output signal Bout2 from the output stage Out-Stg of the second buffer amplifier BUF2 to the second data line DL2 when the positive inversion signal is activated. The second negative output switch SON2 transmits the second output signal Bout2 from the output stage Out-Stg of the second buffer amplifier BUF2 to the first data line DL1 when the negative inversion signal is activated.

In this manner, the display driver having the buffers BUF1 and BUF2 and the switching network of FIG. 8B or 8C drives an LCD panel based on the column inversion method (which is also referred to as the "line inversion method"). Here, the term "column inversion" refers not only to full column inversion but also partial column inversion, such as 2-dot column inversion (or 2-line inversion) and 4-dot column inversion (or 4-line inversion). When an LCD panel includes M scan lines, 1-line inversion indicates full dot inversion and M-line inversion indicates full column inversion.

For example, during a first driving period, the first input signal Vin1 is processed through a data path including the first positive input switch SIP1, the positive buffer amplifier BUF1, and the first positive output switch SOP1 such that the first output signal Bout1 generated from the first input signal Vin1 is applied on the first data line DL1. Also during the first driving period, the second input signal Vin2 is processed through a data path including the second positive input switch SIP2, the negative buffer amplifier BUF2, and the second positive output switch SOP2 such that the second output signal Bout2 generated from the second input signal Vin2 is applied on the second data line DL2. Thus, during the first driving period, the output signal Vout1 having the positive range is transmitted to the first data line DL1, and the output signal Vout2 having the negative range is transmitted to the second data line DL2.

Subsequently during a second driving period, the first input signal Vin1 is processed through a data path including the first negative input switch SIN1, the negative buffer amplifier BUF2, and the second negative output switch SON2 such that the second output signal Bout2 generated from the first input signal Vin1 is applied on the first data line DL1. Also during the second driving period, the second input signal Vin2 is processed through a data path including the second negative input switch SIN2, the positive buffer amplifier BUF1, and the first negative output switch SON1 such that the first output signal Bout1 generated from the second input signal Vin2 is applied on the second data line DL2. Thus, during the second driving period, the first output signal Vout1 having the negative range is applied on the first data line DL1, and the second output signal Vout2 having the positive range is applied on the second data line DL2.

In such inversion driving in FIGS. 8B or 8C, the first buffer amplifier BUF1 generates the corresponding output signal Bout1 having just the positive range, and the second buffer amplifier BUF2 generates the corresponding output signal Bout2 having just the negative range. Such buffers BUF1 and BUF2 and thus the display driver having such buffers BUF1 and BUF2 have reduced power consumption and calorific value from the case of a buffer amplifier generating an output signal in both the positive and negative ranges.

If one buffer amplifier generates an output signal having both of the positive and negative ranges, the difference between the high and low power voltages applied to an output stage of such a buffer amplifier needs to be about the voltage difference of VP-VN illustrated in FIG. 7. In contrast for the display driver of FIG. 8B or 8C, the difference between the power voltages VDDA and VREF1 applied to the output stage Out-Stg of the first buffer amplifier BUF1 is sufficient at about the voltage difference VP-VCOM illustrated in FIG. 7. Similarly, the difference between the power voltages VREF2 and VSSA applied to the output stage Out-Stg of the second buffer amplifier BUF2 is sufficient at about the voltage difference VCOM-VN illustrated in FIG. 7.

Figure 9A:
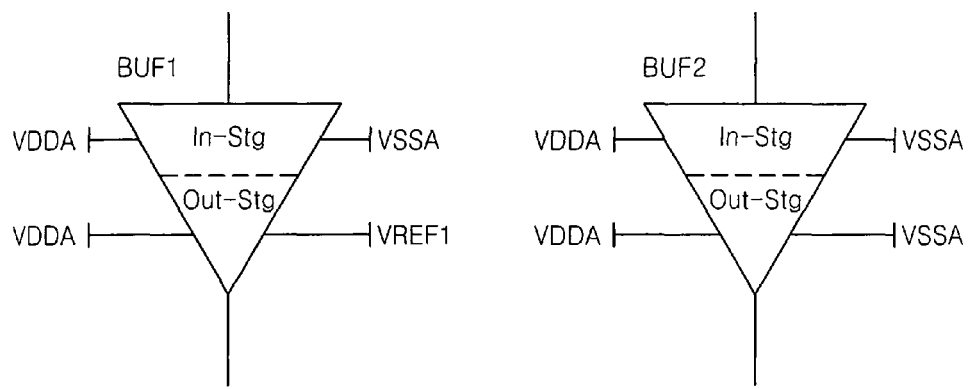
FIGS. 9A and 9B are block diagrams of a display driver with multiple buffer amplifiers with minimized power consumption, according to other embodiments of the present invention.
Figure 9B:
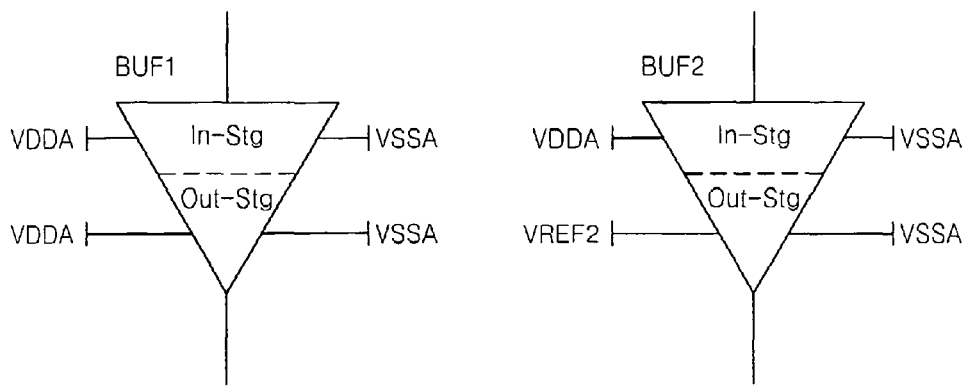

FIGS. 9A and 9B are circuit diagrams of display drivers according to other embodiments of the present invention. Referring to FIG. 9A, the display driver includes a first buffer amplifier BUF1 and a second buffer amplifier BUF2. Also in FIG. 9A, a high power voltage VDDA and a low power voltage VSSA are applied to an input stage In-Stg of the first buffer amplifier BUF1, and the high power voltage VDDA and a first reference power voltage VREF1 are applied to an output stage Out-Stg of the first buffer amplifier BUF1.

For reducing dynamic power consumption at the first buffer amplifier BUF1 of FIG. 9A, the difference between the high power voltage VDDA and the reference power voltage VREF1 is set to be less than the difference between the high power voltage VDDA and the low power voltage VSSA. For example, for reducing the dynamic power consumption at the output stage Out-Stg of the first buffer amplifier BUF1, the reference power voltage VREF1 is set to be higher than the low power voltage VSSA.

In the second buffer amplifier BUF2 of FIG. 9A, the high power voltage VDDA and the low power voltage VSSA are applied to both an input stage In-Stg and an output stage Out-Stg. The total power consumption of the display driver of FIG. 9A is reduced by reducing the dynamic power consumption at just the first buffer amplifier BUF1.

Referring to FIG. 9B, the display driver includes a first buffer amplifier BUF1 and a second buffer amplifier BUF2. In the first buffer amplifier BUF1 of FIG. 9B, a high power voltage VDDA and a low power voltage VSSA are applied to both an input stage In-Stg and an output stage Out-Stg. In the second buffer amplifier BUF2 in FIG. 9B, the high power voltage VDDA and the low power voltage VSSA are applied to an input stage In-Stg, and a second reference power voltage VREF2 and the low power voltage VSSA are applied to an output stage Out-Stg.

For reducing dynamic power consumption at the second buffer amplifier BUF2, the difference between the reference power voltage VREF2 and the low power voltage VSSA is set to be less than the difference between the high power voltage VDDA and the low power voltage VSSA. For example, for reducing the dynamic power consumption at the output stage Out-Stg of the second buffer amplifier BUF2, the reference power voltage VREF2 is set to be lower than the high power voltage VDDA. Thus, the total power consumption by the display driver is minimized by simply reducing the dynamic power consumption at the second buffer amplifier BUF2.

Figure 10A:
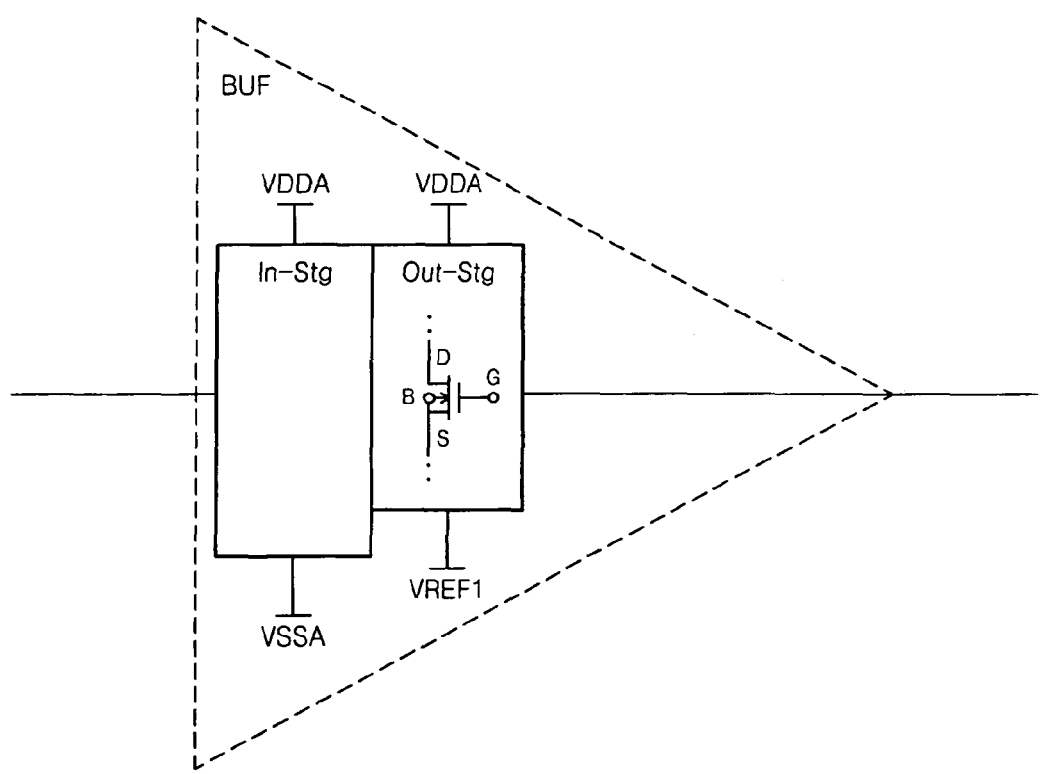
FIGS. 10A, 10B, and 10C are a block diagram and cross-sectional views of a field effect transistor included in an output stage of an example buffer amplifier, according to an embodiment of the present invention.
Figure 10B:
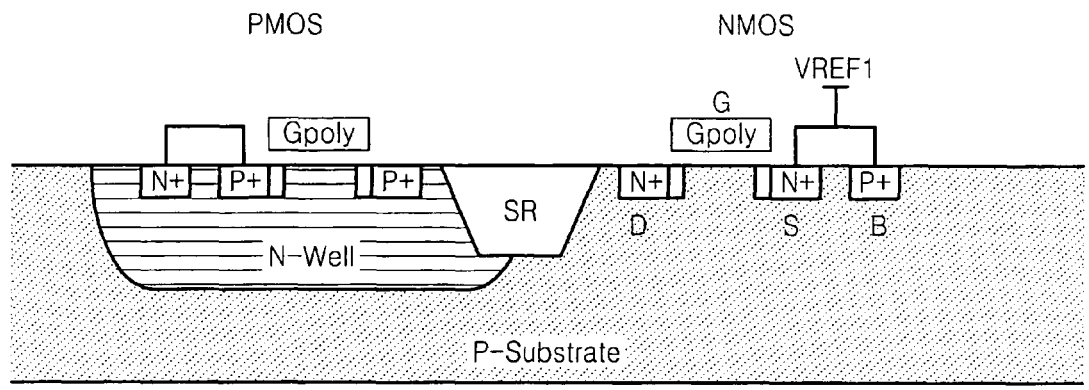
Figure 10C:
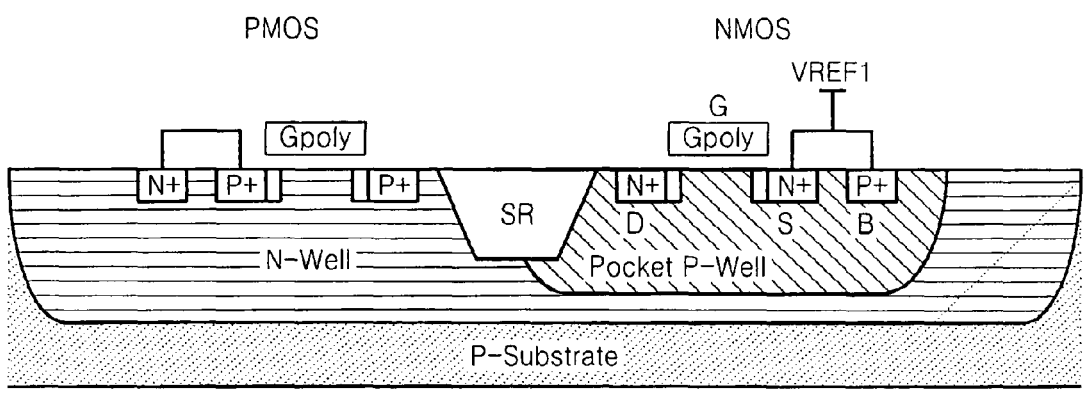

FIG. 10A is a block diagram of a buffer amplifier BUF with reduced power consumption according to an embodiment of the present invention. FIGS. 10B and 10C show cross-sectional views of a transistor included in an output stage Out-Stg of the buffer amplifier BUF of FIG. 10A, according to embodiments of the present invention.

Referring to FIG. 10A, an NMOS transistor included in an output stage Out-Stg has a source terminal S connected directly to a terminal of a reference power voltage VREF1 or connected indirectly to the terminal of the reference power voltage VREF1 via another element. An NMOS transistor illustrated in FIG. 10B and an NMOS transistor illustrated in FIG. 10C each correspond to the NMOS transistor included in the output stage Out-Stg illustrated in FIG. 10A. FIGS. 10B and 10C further illustrate a PMOS transistor that is separated from the NMOS transistor on a P-substrate by a separation region SR. Referring to FIGS. 10A, 10B, and 10C, the NMOS transistor includes a drain terminal D, a gate terminal G, a source terminal S and a body terminal B.

As illustrated in FIGS. 10A, 10B, and 10C, the body terminal B and the source terminal S of the NMOS transistor are connected to each other. A reference power voltage VREF1 (or a-voltage that approximates the reference power voltage VREF1) is applied to the body terminal B and the source terminal S. If the low power voltage VSSA is applied to the P-substrate, a pocket P-well (i.e., a local well) as illustrated in FIG. 10C is desired for the reference power voltage VREF1 (or the voltage that approximates the reference power voltage VREF1) applied to the body terminal B to have an influence on a channel forming region.

In addition, the local pocket P-well is formed in an N-well (i.e., an intermediate well) disposed between the pocket P-well and the P-substrate. If such a pocket P-well is not included as illustrated in FIG. 10B, the reference power voltage VREF1 (or a voltage that approximates the reference power voltage VREF1) applied to the body terminal B may not have a significant influence on the channel forming region such that the on/off operation of the NMOS transistor may be unstable.

In this manner, the dynamic power consumption of the buffer amplifier is reduced without degradation of the offset characteristics of the buffer amplifier. Thus, the calorific value of a display driver having such a buffer amplifier is in turn reduced.

While the present invention has been particularly shown and described with reference to an exemplary embodiment thereof, it will be understood by those of ordinary skill in the art that various changes in form and details may be made therein without departing from the spirit and scope of the present invention as defined by the following claims.

The present invention is limited only as defined in the following claims and equivalents thereof.

What is claimed is:

1. A display driver comprising:
   a first buffer amplifier including:
      a first input stage having high and low power voltages applied thereon; and
      a first output stage having the high power voltage applied thereon, and having a first reference power voltage that is higher than the low power voltage applied thereon; and
   a second buffer amplifier including:
      a second input stage having the high and low power voltages applied thereon; and
      a second output stage having the low power voltage applied thereon, and having a second reference power voltage that is lower than the high power voltage applied thereon;
   wherein the first reference power voltage is applied instead of the low power voltage on the first output stage, and wherein the second reference power voltage is applied instead of the high power voltage on the second output stage, and wherein the first reference power voltage is lower than a common voltage of a display panel, and wherein the second reference power voltage is higher than the common voltage, and wherein the first buffer amplifier and the second buffer amplifier are coupled in parallel.

2. The display driver of claim 1, further comprising:
   a switching network for alternating connection of outputs of the first and second output stages between first and second data lines of a display panel according to polarity inversion.

3. The display driver of claim 2, wherein the switching network alternates application of first and second input signals to the first and second input stages according to polarity inversion.

4. The display driver of claim 1, wherein the low power voltage is applied on the first output stage, and wherein the second reference power voltage lower than the high power voltage is applied on the second output stage.

5. The display driver of claim 1, wherein the first reference power voltage higher than the low power voltage is applied on the first output stage, and wherein the high power voltage is applied on the second output stage.

6. The display driver of claim 1, wherein the first reference power voltage corresponds to a minimum of a first output signal generated by the first buffer amplifier, and wherein the second reference power voltage corresponds to a maximum of a second output signal generated by the second buffer amplifier.

7. The display driver of claim 6, further comprising:
   a switching network for alternating application of the first and second output signals between first and second data lines of the display panel according to polarity inversion,
   wherein the minimum of the first output signal and the maximum of the second output signal correspond to the common voltage applied to a common electrode of the display panel.

8. The display driver of claim 1, wherein at least one of the first and second output stages includes a field effect transistor having source and body regions formed in a local well with an intermediate well disposed between the local well and a substrate, with one of the first and second reference power voltages applied on the source and body regions, and with one of the high and low power voltages applied on the substrate.

9. The display driver of claim 1, wherein the high and low power voltages are set for having a low offset of the first buffer and the second buffer.

10. The display driver of claim 1, wherein each of the first input stage and the second input stage generates at least one transmission signal by differentially amplifying an input signal with a rail-to-rail method.

11. The display driver of claim 1, wherein each of the first output stage and the second output stage includes;
   at least one current mirror unit performing current mirroring in response to at least one transmission signal;
   a bias controller being coupled to the current mirror unit, and controlling the current mirroring in response to a control signal; and
   an output unit being coupled to the current mirror unit and the bias controller, and generating an output signal.

* * * * *